(12) United States Patent
Nishimura et al.

(10) Patent No.: US 9,184,127 B2
(45) Date of Patent: Nov. 10, 2015

(54) SEMICONDUCTOR PACKAGE

(71) Applicant: CANON KABUSHIKI KAISHA, Tokyo (JP)

(72) Inventors: Shinichi Nishimura, Yokohama (JP); Yasuhito Tatara, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/165,154

(22) Filed: Jan. 27, 2014

(65) Prior Publication Data
US 2014/0210065 A1  Jul. 31, 2014

(30) Foreign Application Priority Data
Jan. 31, 2013  (JP) .................... 2013-017618

(51) Int. Cl.
*H01L 23/522* (2006.01)
*H01L 23/66* (2006.01)
*H01L 23/64* (2006.01)
*H01L 23/552* (2006.01)
*H01L 23/13* (2006.01)
*H01L 23/498* (2006.01)

(52) U.S. Cl.
CPC ............ *H01L 23/5222* (2013.01); *H01L 23/13* (2013.01); *H01L 23/552* (2013.01); *H01L 23/642* (2013.01); *H01L 23/66* (2013.01); *H01L 23/49827* (2013.01); *H01L 2224/48091* (2013.01); *H01L 2224/48227* (2013.01); *H01L 2924/15184* (2013.01); *H01L 2924/15311* (2013.01)

(58) Field of Classification Search
CPC ............ H01L 23/5222; H01L 23/5223; H01L 23/5225; H01L 23/642; H01L 23/66
See application file for complete search history.

(56) References Cited

U.S. PATENT DOCUMENTS

| | | | |
|---|---|---|---|
| 5,621,190 A * | 4/1997 | Yamasaki et al. | 174/551 |
| 5,877,551 A * | 3/1999 | Tostado et al. | 257/701 |
| 2004/0036169 A1* | 2/2004 | Higuchi | 257/728 |
| 2004/0257749 A1* | 12/2004 | Otsuka et al. | 361/306.3 |
| 2010/0243872 A1* | 9/2010 | Amano | 250/238 |

FOREIGN PATENT DOCUMENTS

| | | | |
|---|---|---|---|
| JP | 201154643 A | | 3/2011 |
| JP | 2011054643 A | * | 3/2011 |

* cited by examiner

*Primary Examiner* — Michele Fan
(74) *Attorney, Agent, or Firm* — Canon U.S.A., Inc. IP Division

(57) ABSTRACT

A semiconductor package having a metal frame includes a frame-shaped conductive member which has an opening portion, mounted on a substrate, and a semiconductor element disposed within the opening. A ring-shaped wiring pattern is provided on a portion of the substrate outwards from the opening portion of the conductive member. The electrostatic coupling capacity of the ring-shaped wiring pattern and the conductive member is not less than the electrostatic coupling capacity of a semiconductor metal wiring layer and the conductive member. The ring-shaped wiring pattern and the ground wiring of the semiconductor metal wiring layer are electrically connected.

14 Claims, 12 Drawing Sheets

SEMICONDUCTOR PACKAGE

BACKGROUND OF THE INVENTION

1. Field of the Invention

The present invention relates to a semiconductor package used in electronic equipment such as digital multifunction printers digital cameras, and more particularly relates to electromagnetic shielding and capabilities.

2. Description of the Related Art

Cellular telephones and other electronic equipment having wireless communication functions, which perform communication using electromagnetic waves in a frequency band of several hundred MHz to several GHz have come into widespread use in recent years. As such equipment has come into widespread use, there are more instances of using common electronic equipment in close proximity to these equipment. As a result, there is demand for such common electronic devices to have immunity against external electromagnetic waves, so as to operate normally even if subjected to external electromagnetic waves of frequencies in the several hundred MHz to several GHz range.

On the other hand, electronic equipment which acquires images, such as digital copiers and digital cameras, have come to use solid-state imaging elements with higher sensitivity in order to realize higher image quality. Solid-state imaging elements are semiconductor elements of which many parts, such as parts for photoelectric conversion and image signal transmission, are formed of analog circuits. High sensitivity is realized by amplifying very weak electric signals by high gain. Accordingly, the higher the sensitivity is, the weaker the signals handled are. Receiving even very weak external electromagnetic waves, in some cases, may cause interference to occur between the circuit and such very weak external electromagnetic waves, leading to false detection of signals. Thus, such electronic equipment having higher sensitivity requires higher immunity against external electromagnetic waves.

Proposed in Japanese Patent Laid-Open No. 2011-54643 is a method of improving immunity of electronic equipment against external electromagnetic waves. A frame-shaped conductive member is disposed on the inner side of a lead frame formed of a high magnetic permeability material in an analog circuit (or mixed analog circuit including digital circuits) semiconductor package. This arrangement works by attracting external magnetic fields to the high magnetic permeability material on the outer side, generating an opposite magnetic field to the external magnetic field by an eddy current flowing through the frame-shaped conductive member, and cancelling out the external magnetic field by this magnetic field. This configuration is particularly effective in the frequency range of several kHz to several MHz, where AC magnetic field has high effective permeability.

The frame-shaped conductive member has electromagnetic shielding capabilities at frequency bands lower than a particular frequency corresponding to the dimensional size thereof. However, there is a problem that, in the frequency range that is higher than the aforementioned particular frequency, the electromagnetic shielding capabilities gradually degrade as the frequency increases. The reason is that, in such a high frequency range, the electric field becomes a factor which affects the immunity of the semiconductor package against external electromagnetic waves, in addition to the magnetic field. The particular frequency at which the electromagnetic shielding capabilities begin to drop is dependent on the size of the frame-shaped conductive member, and is around 750 MHz in the case of a conductive member 5 cm square. The frame-shaped conductive member needs to be formed smaller than the conductive member to handle higher frequency bands. However, there is a limit to how far semiconductor elements such as solid-state imaging elements can be miniaturized, and there is a possibility that the method described in Japanese Patent Laid-Open No. 2011-54643 cannot ensure sufficient electromagnetic shielding capabilities.

The present invention has been made in light of the above problems, and provides a semiconductor package where a semiconductor element is disposed within an opening portion within a frame-shaped conductive member, which is capable of suppressing degradation that can occur in the frequency range of several hundred MHz to several GHz, thereby improving immunity of the semiconductor circuit against external electromagnetic waves.

SUMMARY OF THE INVENTION

A semiconductor package includes a substrate, a semiconductor element mounted on a surface of the substrate, a dielectric member, a conductive member having a frame shape or ring shape, disposed on the surface of the substrate to which the semiconductor element has been mounted by way of the dielectric member, such that the semiconductor element is exposed from an opening portion of the frame shape or ring shape, a wiring pattern formed on the substrate so as to face the conductive member, a signal wiring layer formed on the semiconductor layer, and a terminal formed at the signal wiring layer as either a ground terminal or a power source terminal. The wiring pattern is electrically connected to the terminal formed at the signal wiring layer provided to the semiconductor element. An electrostatic coupling capacity value between the conductive member and the wiring pattern is not less than an electrostatic coupling capacity value between the conductive member and the signal wiring layer.

Further features of the present invention will become apparent from the following description of exemplary embodiments with reference to the attached drawings.

DESCRIPTION OF THE EMBODIMENTS

First Embodiment

Figure 1A:
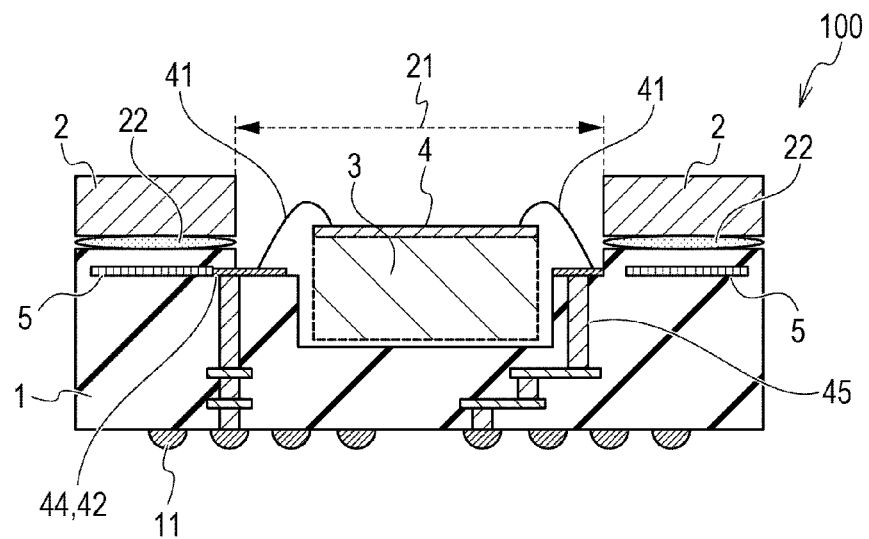
FIGS. 1A and 1B illustrate a semiconductor package according to a first embodiment.
Figure 1B:
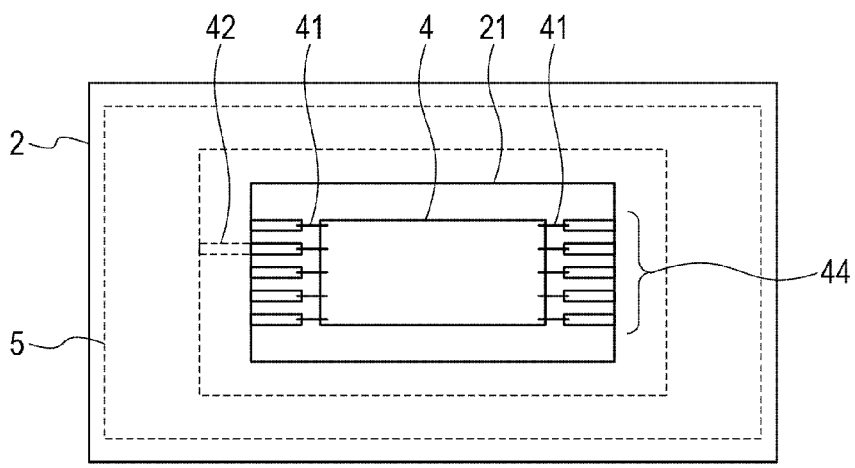

FIGS. 1A and 1B illustrate a semiconductor package according to a first embodiment of the present invention. FIG. 1A is a diagram illustrating a cross-section, and FIG. 1B is a diagram illustrating a top face. Reference numeral 1 denotes a substrate serving as the base of the semiconductor package 100. A conductive member 2 formed of a conductive material such as metal or the like is disposed on top of the substrate 1. The conductive member 2 is a frame-shaped or circular member, having an opening portion 21 formed at the center area thereof. The conductive member 2 is fixed to the substrate 1 by a dielectric member 22 such as an adhesive. A recess is formed at the center area of the substrate 1, where a semiconductor element 3 is disposed. The conductive member 2 is situated so as to surround the outer edges of the semiconductor element 3. The semiconductor element 3 is thus situated so as to be exposed from the opening portion 21 of the conductive member 2, as illustrated in FIG. 1B. The semiconductor element 3 is a CMOS sensor or CCD sensor, for example, and can input external signals via the opening portion 21. To this end, a signal wiring layer 4 is formed at the top face of the semiconductor element 3, so that input signals can be transmitted by the signal wiring. The signal wiring layer 4 is formed at a light receiving surface where external signals are input. Formed in the signal wiring layer 4 are a ground electrode for connection to a later-described wiring pattern 5 formed on the substrate 1, a power source terminal, and signal terminals.

The wiring pattern 5 is provided either to the interior of the substrate 1 or to a surface of the substrate 1 to which the semiconductor element 3 is mounted, such that the wiring pattern 5 faces the conductive member 2. The wiring pattern 5 facing the conductive member 2 may be provided to either the surface of the substrate 1 or within the substrate 1. Alternatively, the wiring pattern 5 may be formed on a surface layer of the substrate 1, a passivation film or the like formed on the wiring pattern 5, and the dielectric member 22 disposed thereupon. The wiring pattern 5 is a frame-shaped or ring-shaped member formed surrounding the semiconductor element 3, as indicated by dotted lines in FIG. 1B. The wiring pattern 5 is formed of a metal having high conductivity, such as copper or tungsten used as wiring material, or the like. On the inner side of the wiring pattern 5, signal wires 44 are formed, including a ground electric potential line and power supply line which are electrically connected via bonding wires to signal terminals of the semiconductor element including ground terminals and power source terminals. The signal wires 44 are connected to signal terminals including ground and power source terminals of the semiconductor element 3, by bonding wires 41. At least one of the signal wires 44 is a ground wire 42, which is connected to the wiring pattern 5. Thus, the wiring pattern 5 is set to the ground electric potential. The signal wires 44 are connected by vias 45 or the like to external electrodes 11 formed on the rear face of the substrate 1. While FIGS. 1A and 1B illustrate the bonding wires 41 directly connected to the signal wires 44, bonding pads may be formed at the end portions of the signal wires 44, by which connection to the bonding wires 41 is realized.

Next, operations of the semiconductor package 100 will be described by way of FIGS. 2A and 2B, which a conceptual diagrams describing an electrical model of the semiconductor package 100 illustrated in FIGS. 1A and 1B. Components in FIGS. 2A and 2B which are the same as those in FIGS. 1A and 1B are denoted with the same reference numerals, and description thereof will be omitted.

Air is interposed between the signal wiring layer 4 and conductive member 2. Air is dielectric, and accordingly the signal wiring layer 4 and conductive member 2 are capacitively coupled. This capacitive coupling is illustrated as an equivalent condenser 61. The wiring pattern 5 and conductive member 2 are disposed facing one another, with insulating material of the substrate 1 and the dielectric member 22 interposed therebetween. Thus, the wiring pattern 5 and conductive member 2 are capacitively coupled. This capacitive coupling is illustrated as an equivalent condenser 62. The present embodiment is configured such that the capacitance value of the condenser 62 between the wiring pattern 5 and conductive member 2 is not less than the capacitance value of the condenser 61 between the signal wiring layer 4 and the conductive member 2.

The substrate 1 is preferably formed using a material with a high dielectric constant, such as a glass epoxy resin FR-4, alumina, a ceramic such as a steatite ceramic, or the like, as these raise the capacitance value of the condenser 62. The dielectric member 22 is preferably formed using an epoxy resin adhesive including a filler of glass or the like (relative dielectric constant around 5.0), silicone resin (around 5.0), or the like, rather than a normal thermosetting epoxy resin adhesive (relative dielectric constant around 3.0). Also, in the case of using an ultraviolet curing epoxy resin adhesive, such as is often used in optical elements, one with a similarly high dielectric constant is preferably used.

Figure 2A:
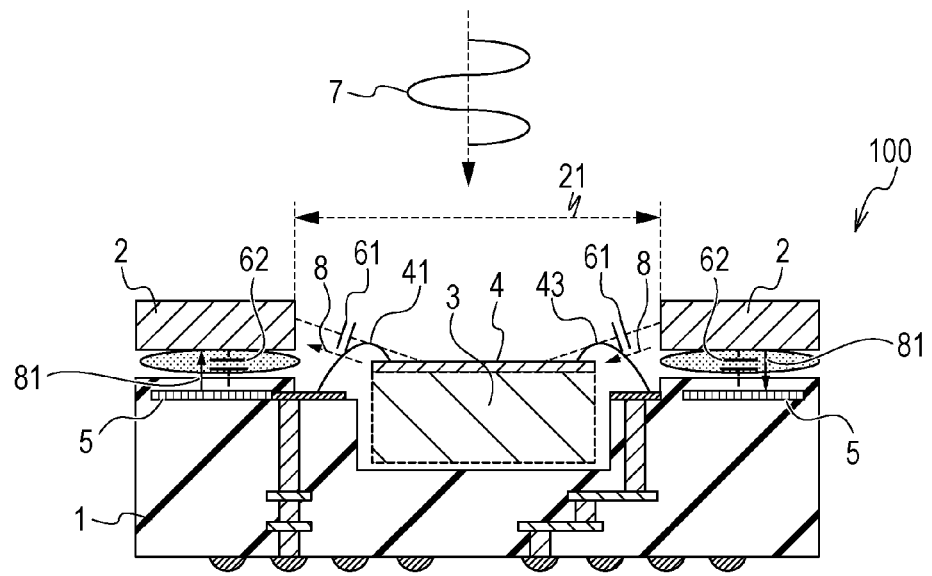
FIGS. 2A and 2B are schematic diagrams illustrating operation of the semiconductor package according to the first embodiment.
Figure 2B:
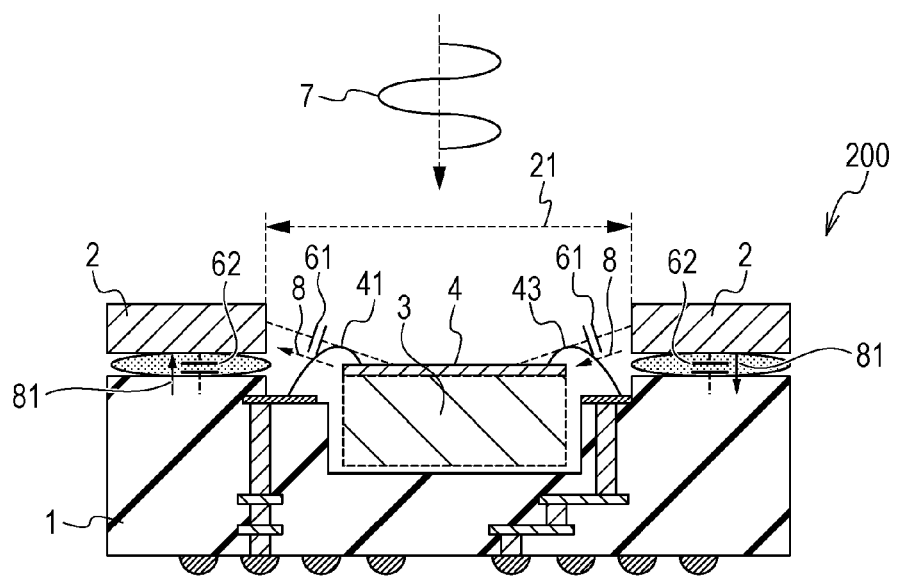

Reference numeral 7 in FIGS. 2A and 2B denote electromagnetic waves in a band range of several hundred MHz to several GHz, irradiate from above the semiconductor package 100. The arrows indicate the direction in which the electromagnetic waves 7 are traveling, and the solid lines indicate the intensity of the electric field component in terms of amplitude. The magnetic field component has a component which oscillates in a direction orthogonal to the plane of the drawing, though omitted from illustration to facilitate description.

First, the input electromagnetic waves 7 act to electrically excite the condenser 61 formed at the gap between the conductive member 2 and the signal wiring layer 4. This generates electric potential difference between the conductive member 2 and the signal wiring layer 4. In the same way, the input electromagnetic waves 7 act to electrically excite the condenser 62 between the wiring pattern 5 and the conductive member 2. The electric potential thus generated is applied to a resonant circuit made up of a first circuit formed of the condenser 61 and the inductance component of the conductive member 2 and the inductance component of the signal wiring layer 4, and a second circuit formed of the condenser 62 and the inductance component of the conductive member 2 and the inductance component of the wiring pattern 5.

In the semiconductor package 100 according to the first embodiment illustrated in FIG. 2A, by providing the wiring pattern 5, the capacitance value of the condenser 62 that occurs between the conductive member 2 and the wiring pattern 5 is not less than the capacitance value of the condenser 61. In this case, a major part of the resonant current flowing through the resonant circuit flows through the condenser 62 in the second circuit having a lower impedance. Accordingly, a resonant electric field 81 generated between the conductive member 2 and the wiring pattern 5 is greater than a resonant electric field 8 generated between the conductive member 2 and the signal wiring layer 4. This reduces effects of the external electromagnetic waves 7 on the bonding wires 41 which are vulnerable to noise, thereby providing the conductive member 2 with improved electromagnetic shielding capabilities.

In contrast, in a semiconductor package 200 illustrated in FIG. 2B having no wiring pattern 5, the capacitance value of the condenser 62 between the conductive member 2 and the substrate 1 is not smaller than the capacitance value of the condenser 61. In this case, a major part of the resonant current flowing through the resonant circuit flows through the condenser 61 having a lower impedance. Accordingly, the resonant electric field 8 generated between the conductive member 2 and the signal wiring layer 4 is greater than the resonant electric field 81 generated between the conductive member 2 and the substrate 1. Consequently, the effects of the external electromagnetic waves 7 on the bonding wires 41 which are vulnerable to noise are large, as compared to the embodiment illustrated in FIG. 2A. A conceivable case where the capacitance value at the condenser 62 is lower than the capacitance value at the condenser 61 is an arrangement where no wiring pattern 5 is provided.

Exemplary embodiments illustrating the advantages of the semiconductor package 100 according to the present embodiment will be described below.

First Exemplary Embodiment

For a first exemplary embodiment, a foamed styrol material having a relative dielectric constant $\in_r$ of 1.0 F/m and dimensions of 26 mm long, 32 mm wide, and 2.1 mm thick, was used as the substrate 1. A material with a high dielectric constant is preferable for the substrate 1 as described above, but foamed styrol with a relative dielectric constant $\in_r$ of 1.0 F/m was intentionally selected here to facilitate understanding of the advantages of the invention by equalizing conditions with later-described analysis results. The frame-shaped wiring pattern 5 formed on the upper face of the substrate 1 having an actual relative dielectric constant such as described above so as to face the conductive member 2 was a wiring pattern of a copper line 2 mm wide that circles around. The electric conductivity σ of the copper line was $5.7 \times 10^7$ S/m. The wiring pattern 5 was situated at a position 0.3 mm from the upper face of the substrate 1.

The conductive member 2 was formed of a stainless steel plate having electric conductivity σ of $1.5 \times 10^6$ S/m and dimensions of 26 mm wide, 32 mm long, and 0.8 mm thick. An opening portion 21, 21 mm wide and 27 mm long, was formed in the stainless steel plate. The distance between the conductive member 2 and the substrate 1 was 0.1 mm, and the two were bonded by an epoxy resin adhesive having a relative dielectric constant of $\in_r=4$. Accordingly, the distance between the conductive member 2 and the wiring pattern 5 was 0.4 mm.

The semiconductor element 3 was a solid-state imaging element formed of silicon and laminated aluminum wiring, having dimensions of 20 mm long, 25 mm wide, and 0.8 mm thick. A lattice-form aluminum film, 1 μm thick, was formed on the surface of the semiconductor element 3 to serve as the signal wiring layer 4.

The electrostatic coupling capacity value of the signal wiring layer 4 and conductive member 2 (equivalent to the condenser 61) was 2.8 pF. This electrostatic coupling capacity was measured by bringing the signal parts and ground parts of a high-frequency measuring probe (manufactured by Cascade Microtech, Inc.) into contact with the conductive member 2 and signal wiring layer 4 respectively, with the probe connected to a network analyzer (manufactured by Agilent Technologies, Inc.). Measurement was performed as follows. Reflection coefficient S11 was measured for 100 MHz through 2.5 GHz by the network analyzer having an input impedance of 50Ω, and then converted into input impedance Z11. In the case of the network analyzer having an input impedance of 50Ω, the conversion expression is Z11=(50× (1+S11)/(1−S11). A capacitance value C was calculated based on the input impedance Z11 using the expression $$C=1/(2\pi f \times |Z11|)$$

where f represents frequency. Measurement was performed in a state where the conductive material and signal wiring layer were not in an electrically connected state, so the capacitance value C is equivalent to the electrostatic coupling capacity between the conductive material and signal wiring layer.

Measuring the electrostatic coupling capacity value between the wiring pattern 5 and conductive member 2 (equivalent of the condenser 62) according to the same method yielded 5.0 pF. This is 1.78 times or greater than the electrostatic coupling capacity value between the signal wiring layer 4 and the conductive member 2 (equivalent of the condenser 61).

Electric field intensity at the opening portion 21 of the conductive member 2 was measured. First, the semiconductor package was placed at a position 1 m away from a transmitting antenna situated in an anechoic chamber. The semiconductor package was then irradiated with electromagnetic waves having a constant electric field intensity of 10 V/m, over a frequency band range of 1 GHz to 2.5 GHz.

Electric field was detected by situating a reception antenna (commercially-available optical electric field probe mounted with an infinitesimal dipole antenna 10 mm long) within the opening portion 21. The detection signals thereof were transmitted by optical fiber and input to a spectrum analyzer situated outside of the anechoic chamber, thus measuring the electric field intensity.

Figure 3A:
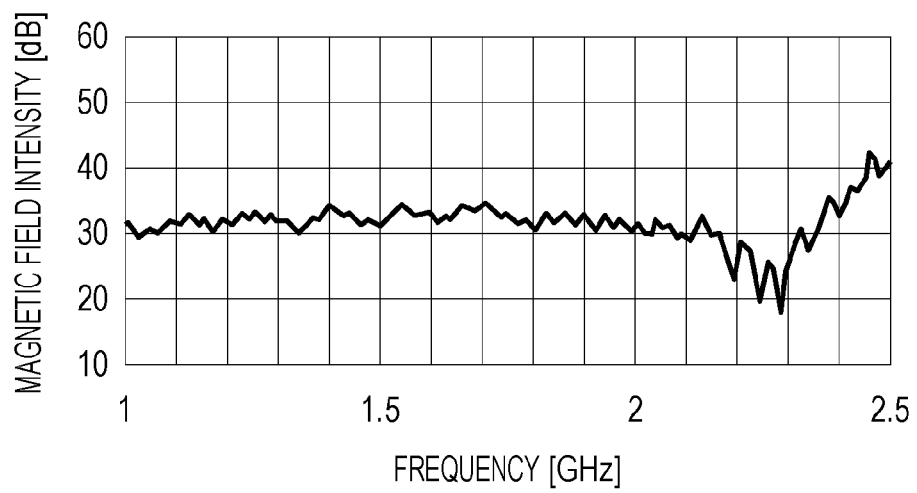
FIGS. 3A and 3B are graphs illustrating advantages of the first embodiment.

FIG. 3A illustrates the measurement results. The horizontal axis of FIG. 3A represents the frequency of the irradiated electromagnetic waves (1.0 GHz to 2.5 GHz) and the vertical axis represents the value of the electric field generated at the opening portion 21 of the conductive member 2 as measured at the optical electric field probe. The measured value of the optical electric field probe is proportionate to the intensity of the electric field. It can be understood from FIG. 3A that the intensity of the electric field generated at the opening portion 21 of the conductive member 2 was 40 dB at frequency of 2.5 GHz.

First Comparative Example

Measurement was performed in the same way as with the first exemplary embodiment, on a semiconductor package the same as that according to the first exemplary embodiment but with the wiring pattern 5 excluded. The electrostatic coupling capacity value that occurs between the signal wiring layer 4 and conductive member 2 (equivalent to the condenser 61) was 2.8 pF, which was the same as with the first exemplary embodiment.

Figure 3B:
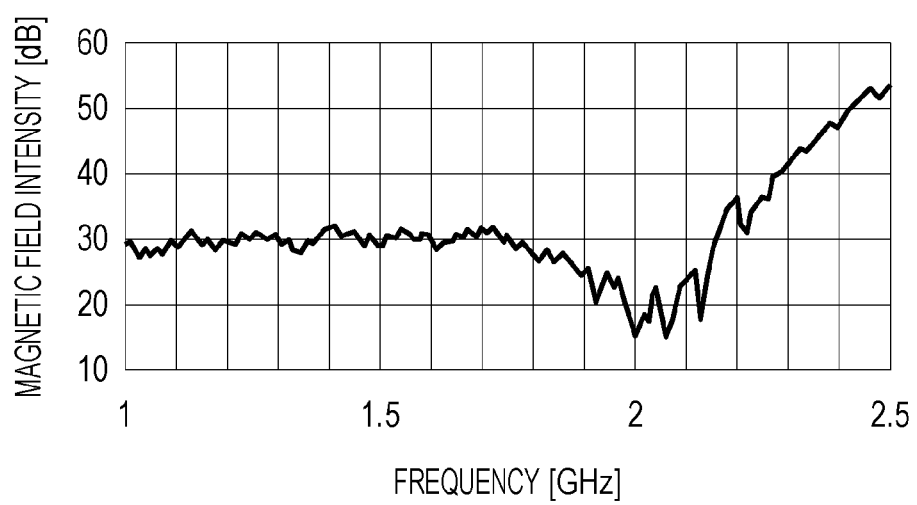

The measurement results are illustrated in FIG. 3B. It can be understood from FIG. 3B that the intensity of the electric field generated within the opening portion 21 of the conductive member 2 at frequency of 2.5 GHz is approximately 52 dB.

This is a reduction of 12 dB for the semiconductor package according to the first embodiment as compared to the semiconductor package according to the comparative example, i.e., approximately ¼ lower. It can thus be seen that degradation of electromagnetic shielding capabilities of the conductive member is suppressed in the frequency band range of 1.0

GHz to 2.5 GHz and that electromagnetic shielding of the semiconductor circuit according to the first embodiment is superior.

Next, 3D numerical electromagnetic field analysis was performed to verify the advantages of the present embodiment at frequency bands higher than the frequency band range of 1.0 GHz to 2.5 GHz illustrated in FIGS. 3A and 3B. This 3D numerical electromagnetic field analysis was performed on second and third embodiments described below, in addition to the above-descried first exemplary embodiment and first comparative embodiment.

Second Exemplary Embodiment

Only points which differ from the first exemplary embodiment will be described. The distance between the conductive member 2 and the substrate 1 is 0.1 mm, and the wiring pattern 5 is situated at a position 0.7 mm from the upper face of the substrate 1. Accordingly, the distance between the conductive member 2 on the substrate 1 and the wiring pattern 5 was 0.8 mm. The electrostatic coupling capacity value of the wiring pattern 5 and conductive member (equivalent to the condenser 62) was 2.8 pF. This value was equal to the electrostatic coupling capacity value of the signal wiring layer 4 and conductive member 2 (equivalent to the condenser 61).

Third Exemplary Embodiment

Only points which differ from the first exemplary embodiment will be described. The distance between the conductive member 2 and the substrate 1 is 0.05 mm, and the wiring pattern 5 is situated on the surface of the substrate 1. Accordingly, the distance between the conductive member 2 and the wiring pattern 5 was 0.05 mm. The electrostatic coupling capacity value of the wiring pattern 5 and conductive member 2 (equivalent to the condenser 62) here was 38 pF.

The software used for analysis was MW-Studio (Manufactured by Computer Simulation Technology), which is a time-domain transient solver program. The three-dimensional forms and material properties of the first through third exemplary embodiments and the first comparative example were input, and analysis models were created. The analysis conditions were the same as with the measurements. That is to say, the semiconductor packages were irradiated with electromagnetic waves 7 having a constant intensity of 10 V/m, at a direction orthogonal to the plane of the opening portion 21 of the conductive member 2, so that an electric field was generated at the opening portion 21 of the conductive member 2. This was performed over a frequency band range of 1 GHz to 5 GHz. The solver calculated the electric field intensity within the analysis space, and more particularly calculated the electric field intensity at the opening portion 21 of the conductive member 2.

Figure 4:
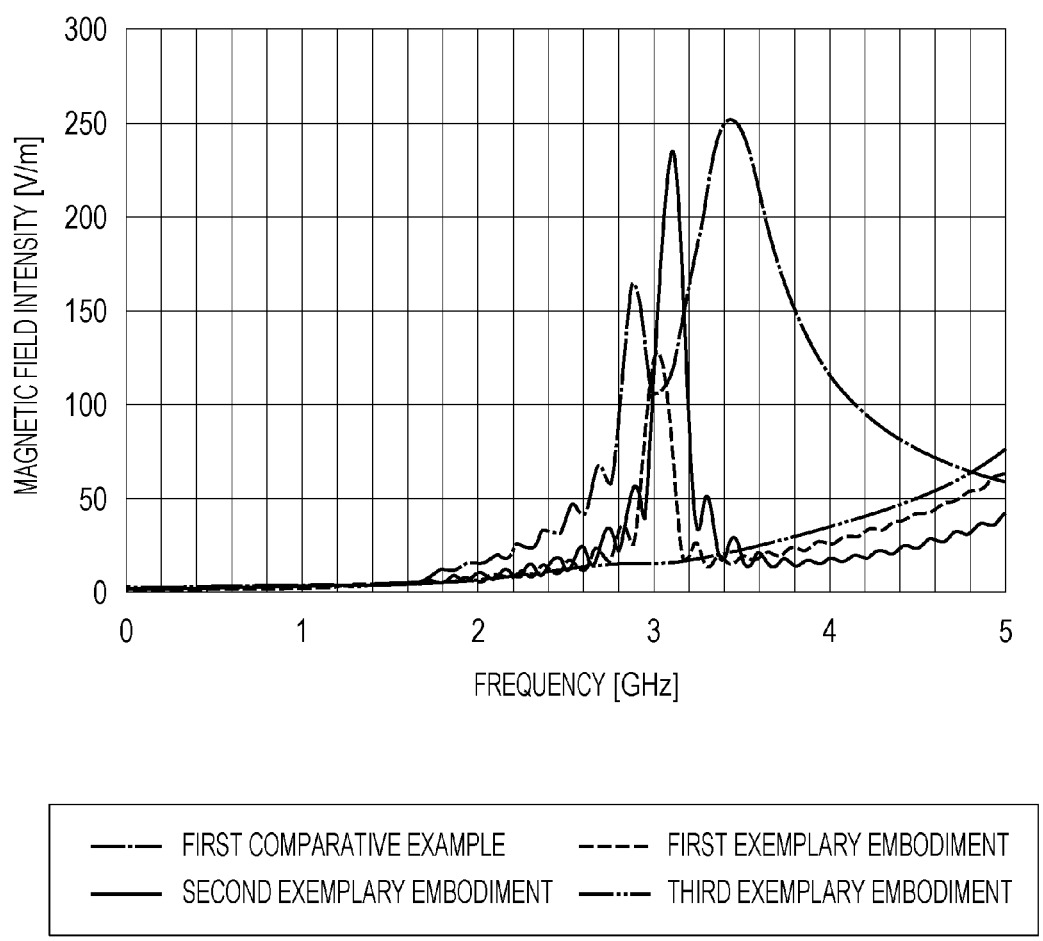
FIG. 4 is a graph illustrating advantages of the first embodiment.

FIG. 4 illustrates the analysis results. The horizontal axis represents the frequency of the irradiated electromagnetic waves, and the vertical axis represents the electric field intensity at the opening portion 21 of the conductive member 2. First, looking at the electric field intensity of the first comparative example indicated by a single-dot dashed line, it can be seen that there is a sudden increase from around 2 GHz, with high levels of electric field intensity peaking at 2.9 GHz and 3.4 GHz. This indicates that the semiconductor package according to the comparative example has low electromagnetic shielding capabilities of the conductive member at frequency bands above 2 GHz. This tendency indicated by analysis of the comparative example closely resembles the tendency actually measured as illustrated in FIG. 3B. Accordingly, we can say that the software used for analysis and the analysis model gave the correct results.

The analysis results of the first exemplary embodiment are indicated in FIG. 4 by a dashed line. We can see from FIG. 4 that the electric field intensity within the opening portion peaks around 3.0 GHz, having reached 120 V/m. This is half of the value given by the analysis results of the first comparative example. In the first exemplary embodiment, the electrostatic coupling capacity (condenser 62) between the conductive member 2 and wiring pattern 5 was 5 pF, which was greater than the electrostatic coupling capacity between the conductive member 2 and the signal wiring layer 4. Accordingly, the resonant electric field was generated more on the outer side of the opening portion of the conductive member, further reducing the electric field intensity within the opening portion of the conductive member.

The analysis results of the second exemplary embodiment are indicated in FIG. 4 by a solid line. We can see from FIG. 4 that the electric field intensity within the opening portion peaks around 3.1 GHz, having reached 230 V/m. This is 20 V/m lower than the analysis results of the first comparative example, which were electric field intensity of 250 V/m at 3.4 GHz. In the second exemplary embodiment, the electrostatic coupling capacity (condenser 62) between the conductive member 2 and wiring pattern 5 was 2.8 pF, which was around the same as the electrostatic coupling capacity between the conductive member 2 and the signal wiring layer 4. Accordingly, the resonant electric field can assumed to be also generated on the outer side of the opening portion of the conductive member, reducing the electric field intensity within the opening portion of the conductive member.

The analysis results of the third exemplary embodiment are indicated in FIG. 4 by a two-dot dashed line. We can see from FIG. 4 that there is no peak in electric field intensity between 3.0 GHz to 3.5 GHz, just an overall level of around 20 V/m. This is markedly lower than the value given by the analysis results of the first comparative example. In the third exemplary embodiment, the electrostatic coupling capacity (condenser 62) between the conductive member 2 and wiring pattern 5 was 38 pF, which was far greater than the electrostatic coupling capacity between the conductive member 2 and the signal wiring layer 4. Accordingly, the resonant electric field can be assumed to be generated almost exclusively on the outer side of the opening portion of the conductive member, and hardly any is generated within the opening portion of the conductive member.

Thus, according to the first through third exemplary embodiments of the semiconductor package according to the present invention, degradation in electromagnetic shielding capabilities of the conductive member at the frequency band range of 1 to 5 GHz can be suppressed, and immunity of the semiconductor circuit against electromagnetic waves can be improved.

While an arrangement has been described in the present embodiment where the wiring pattern 5 is connected to the ground wiring of the signal wiring layer 4, the wiring pattern 5 may be connected to the power source terminal of the semiconductor element 3 instead. This arrangement also yields the advantage of suppressing degradation in electromagnetic shielding capabilities. This arrangement is further advantageous in that the power source voltage of the semiconductor circuit is stabilized by the electrostatic coupling capacity between the wiring pattern 5 and conductive member 2 (equivalent of the condenser 62). Accordingly, this is advantageous in that stable operation can be realized while improving immunity of the semiconductor circuit against electromagnetic waves.

Further, connection between the wiring pattern 5 and signal wiring layer 4 is not restricted to one point by a bonding wire 41; rather, two or more points may be provided. This is advantageous in that the electric potential between the conductive member 2 and signal wiring layer 4 further stabilizes, yielding even higher electromagnetic shielding capabilities.

Next, electromagnetic shielding capabilities were confirmed with different connection conditions regarding the ground wiring of the signal wiring layer 4 of the semiconductor element 3 and the ground wiring of the wiring pattern 5.

Fourth Through Sixth Exemplary Embodiments

Figure 5A:
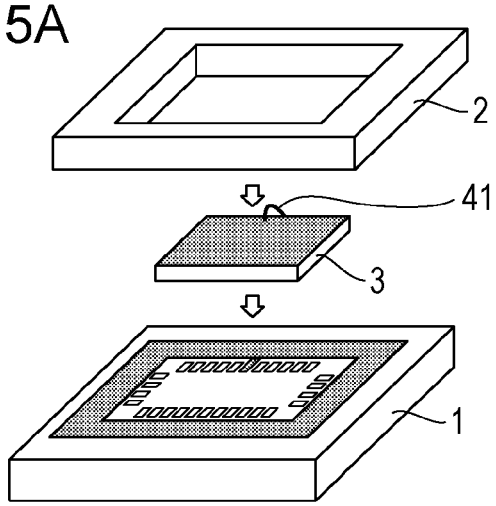
FIGS. 5A through 5C illustrate semiconductor packages according to fourth through sixth exemplary embodiments.
Figure 5B:
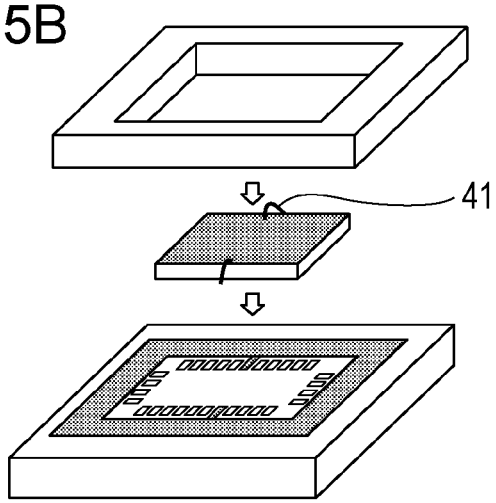
Figure 5C:
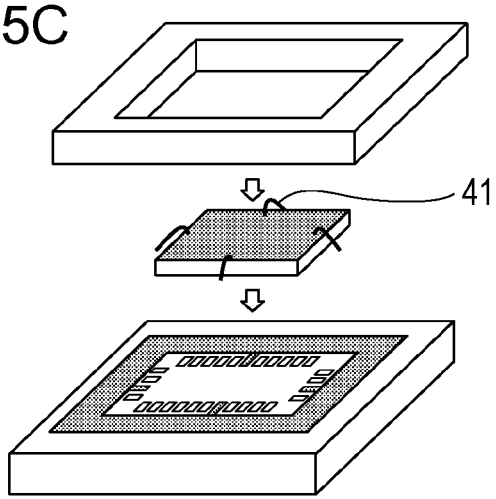

Only points which differ from the first exemplary embodiment will be described. In the fourth exemplary embodiment, the ground wiring of the signal wiring layer 4 and the ground wiring of the wiring pattern 5 were connected by a bonding wire 41 at just one place, as schematically illustrated in FIG. 5A. In the fifth exemplary embodiment, the ground wiring of the signal wiring layer 4 and the ground wiring of the wiring pattern 5 were connected by bonding wires 41 at two places, across the semiconductor element 3, as schematically illustrated in FIG. 5B. In the sixth exemplary embodiment, the ground wiring of the signal wiring layer 4 and the ground wiring of the wiring pattern 5 were connected by bonding wires 41 at four places, one on each of the four sides of the semiconductor element 3, as schematically illustrated in FIG. 5C.

Figure 6A:
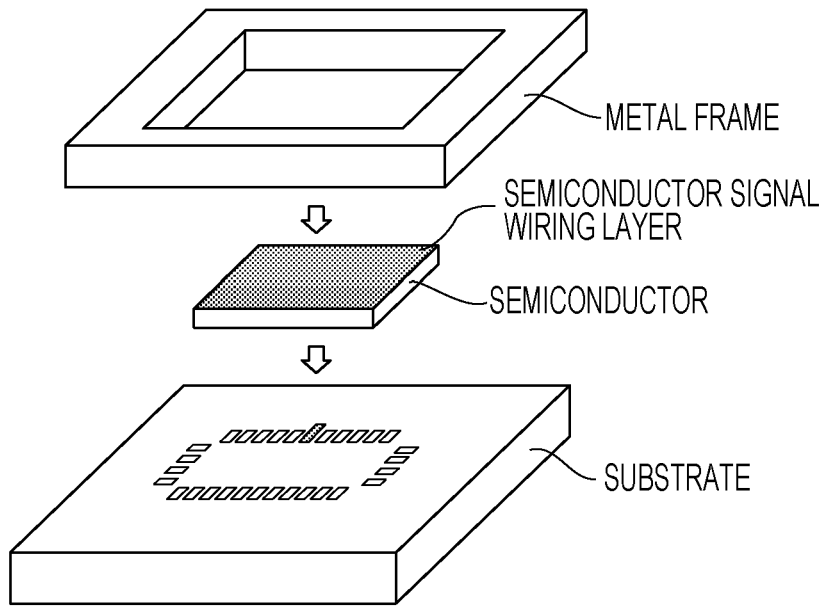
FIGS. 6A and 6B illustrate semiconductor packages according to a conventional example and a second comparative example.
Figure 6B:
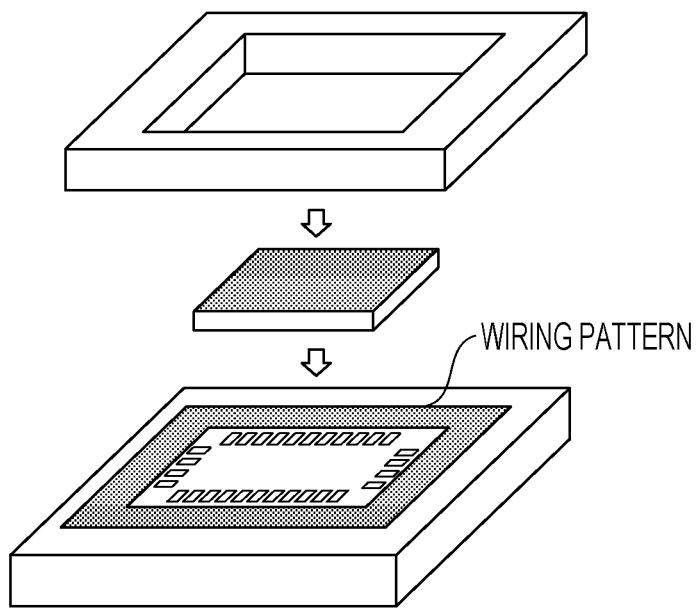

FIG. 6A is a schematic drawing of the conventional example illustrated in FIG. 2B, described earlier. No wiring pattern 5 is provided in the arrangement illustrated in FIG. 6A. While the arrangement illustrated in FIG. 6B as a second comparative example does have a wiring pattern 5 provided on the substrate 1, the ground wiring of the signal wiring layer 4 and the ground wiring of the wiring pattern 5 are not connected.

Figure 7:
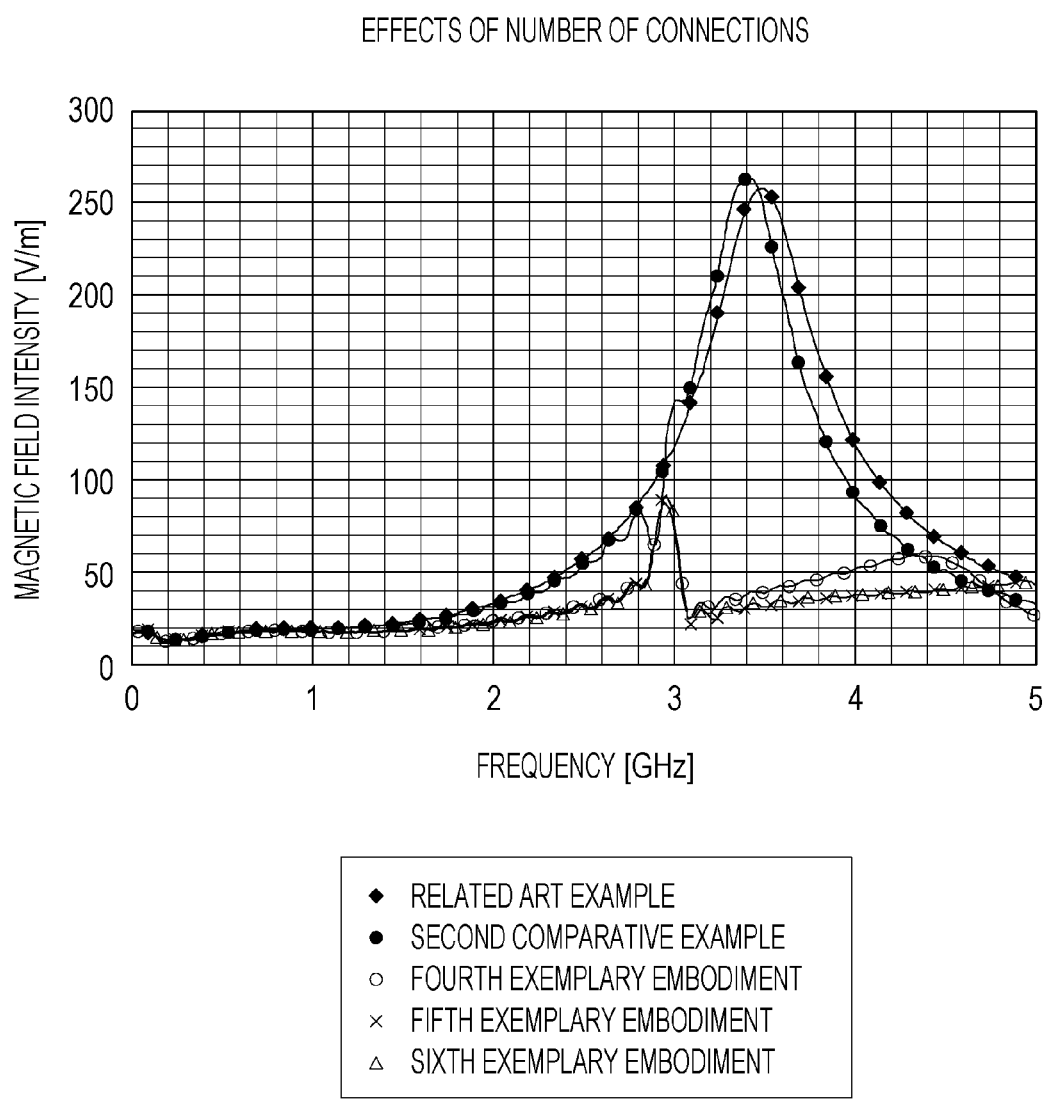
FIG. 7 is a graph illustrating advantages of the fourth through sixth exemplary embodiments.

The fourth through sixth exemplary embodiments, the conventional example, and the second comparative example were subjected to calculation of electric field intensity using MW-Studio software (Manufactured by Computer Simulation Technology, in the same way as that illustrated in FIG. 4. This was performed over a frequency band range of 1 GHz to 5 GHz. FIG. 7 is a graph illustrating the analysis results thereof.

We can see from FIG. 7 that connecting the wiring pattern to the power source or ground terminal of the signal wiring layer on the semiconductor element, as in the case of the fourth exemplary embodiment, markedly reduces the electric field intensity within the metal frame. Further, connecting at multiple sides, as with the fifth and sixth embodiments, further reduces the electric field intensity within the metal frame. On the other hand, it can be seen that the electric field intensity within the metal frame cannot be suppressed from being high, since the wiring pattern is not connected to the power source or ground terminal of the signal wiring layer on the semiconductor element.

Note that while the ground wiring of the signal wiring layer 4 and the ground wiring of the wiring pattern 5 are connected by bonding wires 41 in the fourth through sixth exemplary embodiments, the same advantages can be obtained by connecting the power source wiring of the signal wiring layer 4 and the power source wiring of the wiring pattern 5.

Second Embodiment

Figure 8A:
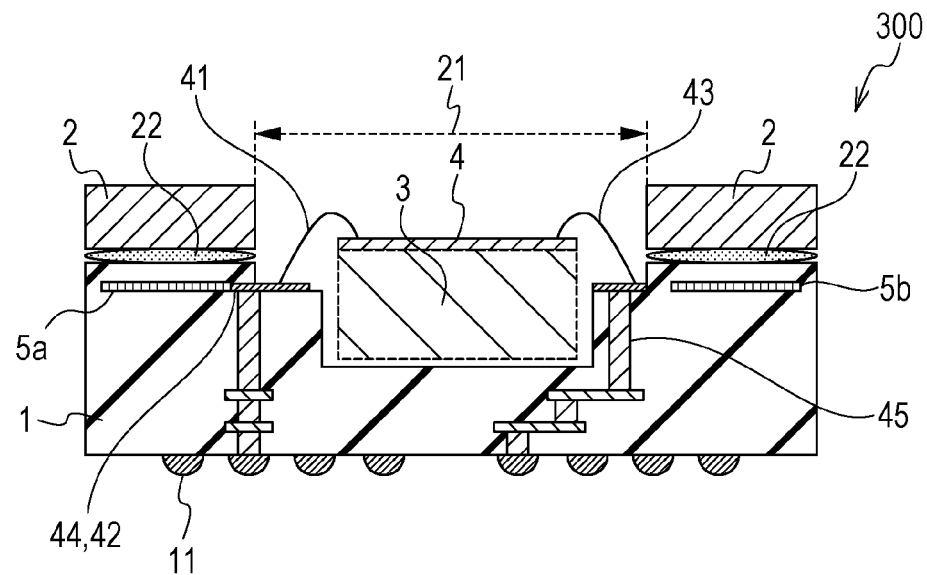
FIGS. 8A and 8B illustrate a semiconductor package according to a second embodiment.
Figure 8B:
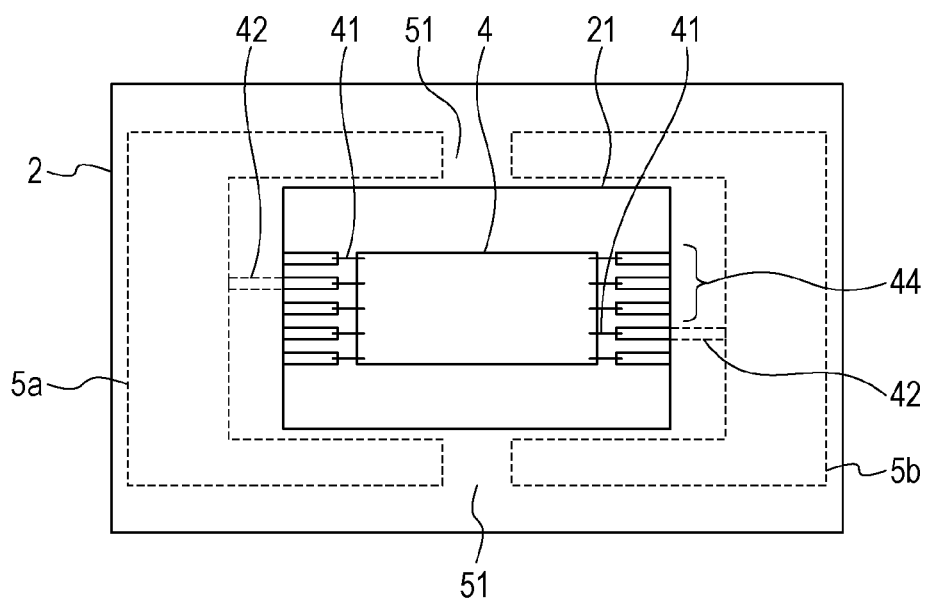

FIGS. 8A and 8B illustrate a semiconductor package 300 according to a second embodiment of the present invention. FIG. 8A is a diagram illustrating a cross-section, and FIG. 8B is a diagram illustrating a top face. Parts in FIGS. 8A and 8B which are the same as those of the first embodiment are denoted with the same reference numerals, and description thereof will be omitted.

The semiconductor package 300 includes two wiring patterns 5a and 5b, which are formed by providing the wiring pattern 5 according to the first embodiment with gap portions 51 at two positions on opposing sides of the semiconductor element 3. The two gap portions 51 are formed at two positions facing each other. The gap portions 51 may be formed at diagonally opposing points. The resulting electrostatic coupling capacity value that occurs between the separated wiring patterns 5a and 5b and the conductive member 2 is greater than the electrostatic coupling capacity value that occurs between the signal wiring layer 4 and conductive member 2 (equivalent to the condenser 61). The separated wiring patterns 5a and 5b are each connected to the ground wiring of the signal wiring layer 4 by bonding wires 41 and the ground wire 42.

At the gap portion 51, the electrostatic coupling capacity value of the condenser 62 that occurs between the separated wiring patterns 5a and 5b and the conductive member 2 is smaller. A smaller electrostatic coupling capacity value means a partial increase in impedance of the conductive material. This partially high impedance acts to suppress resonant current when external electromagnetic waves are input.

This suppressing effect will be described. The length of the gap portion 51 between the wiring pattern 5a and wiring pattern 5b is preferably wider than the width of the wiring patterns 5a and 5b, but shorter than the length of the sides. If the gap portion is too narrow, the electrostatic coupling capacity value of the coupling capacity (condenser 62) does not drop. If the gap portion is too wide, the resulting electrostatic coupling capacity value that occurs between the separated wiring patterns 5a and 5b and the conductive member 2 will be smaller than the electrostatic coupling capacity value that occurs between the signal wiring layer 4 and conductive member 2.

First, electromagnetic waves 7 are externally input to the semiconductor package 300 according to the present embodiment. The input electromagnetic waves 7 act to internally electrically excite the coupling capacity between the signal wiring layer 4 and conductive member 2 (equivalent to the condenser 61). This generates electric potential difference between the conductive member 2 serving as a condenser electrode and the signal wiring layer 4. This electric potential is applied to a resonant circuit made up of the condenser 61 between the conductive member 2 and signal wiring layer 4, and the parasitic inductance component of the conductive member 2 or the parasitic inductance component signal wiring layer 4. A powerful resonant current flows at the resonant frequency of this circuit.

Figure 9A:
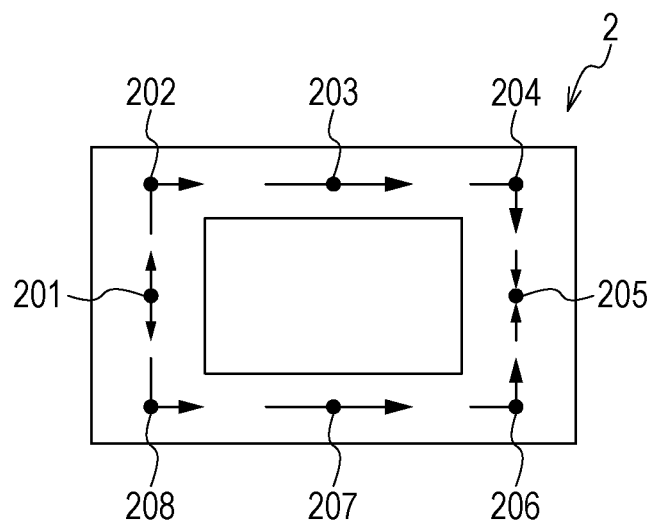
FIGS. 9A and 9B are schematic diagrams illustrating advantages of the semiconductor package according to the first embodiment.
Figure 9B:
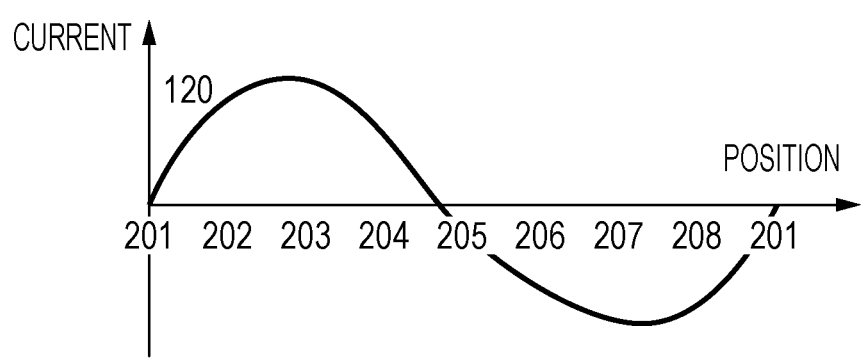

FIG. 9A illustrates is a schematic diagram illustrating the flow of resonant current at points 201 through 208 within the conductive member 2, in a case where no gap portions 51 are provided. This corresponds to the first embodiment. In FIG. 9A, the direction of the arrows represents the direction of the current, and the length of the arrows represents the magnitude of the current. These arrows represent direction and magnitude at a certain instant in AC, so the directions of the arrows are periodically inverted, and the magnitude periodically fluctuates. FIG. 9B schematically illustrates the direction and magnitude of the current at each of the points 201 through 208. In the graph in FIG. 9B, the horizontal axis represents the position in the peripheral direction of the conductive member (points 201 through 208), and the vertical axis represents the current value. Accordingly, the positive and negative sides of the vertical axis represent the directions of the current.

We can see from FIG. 9B that the wavelength of the resonant current is such that the circumferential length around the conductive member 2 (from point 201 around back to point 201 again) is roughly one wavelength. The distribution of the resonant current is such that there are two antinodes where the current greatly fluctuates and two nodes where there is little fluctuation, alternately situated along the circumferential length.

Figure 10A:
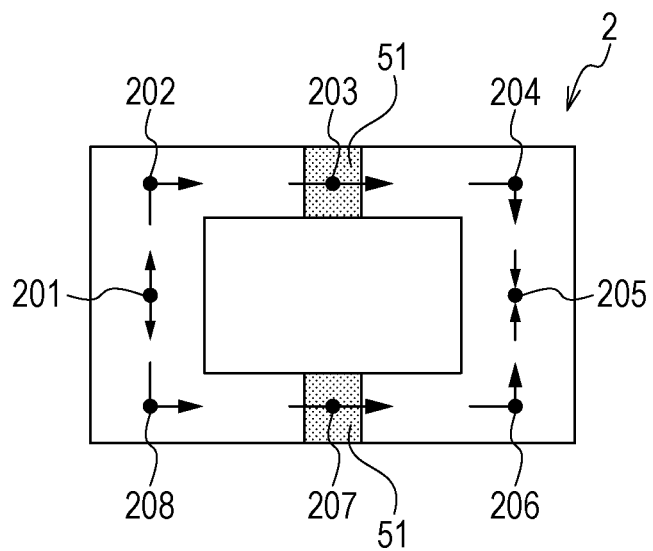
FIGS. 10A and 10B are schematic diagrams illustrating advantages of the semiconductor package according to the second embodiment.
Figure 10B:
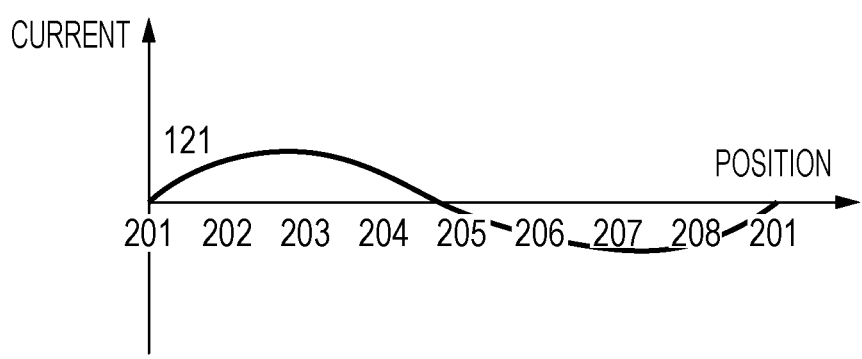

FIG. 10A is a schematic diagram illustrating the flow of resonant current at points 201 through 208 within the conductive member 2, in a case where the gap portions 51 are provided, in comparison with the first embodiment illustrated in FIG. 9A. The gap portions 51 in FIG. 10A are formed at positions corresponding to the two positions of the antinodes in FIG. 9B where the current value is great. FIG. 10B schematically illustrates the direction and magnitude of the current at each of the points 201 through 208 at this time. FIG. 10B illustrates that the gap portions 51 where impedance is high reduce the Q value of the resonator structure which is the conductive member 2, thereby attenuating the resonant current.

Accordingly, reduction in the resonant current itself that flows through the conductive member reduces both the resonant electric field generated between the conductive member 2 and wiring pattern 5, and the resonant electric field 8 between the conductive member 2 and signal wiring layer 4. Thus, the intensity of the electric field at the opening portion 21 of the conductive member 2 is lower as compared to the first embodiment, thereby providing improved electromagnetic shielding capabilities even at higher frequencies.

An exemplary embodiment illustrating the advantages of the semiconductor package 300 will be described next.

Seventh Exemplary Embodiment

The conductive member 2, semiconductor element 3, and signal wiring layer 4 of the semiconductor package 300 were the same as those described in the first exemplary embodiment. The electrostatic coupling capacity value of the conductive member 2 and signal wiring layer 4 (equivalent to the condenser 61) was 2.8 pF. The wiring patterns 5a and 5b were the same as the wiring pattern 5 according to the first exemplary embodiment with regard to dimensions and material, and the gap portions 51 were situated at two points on opposing sides. The widths of the gap portions 51 were 2 mm. The distance between the conductive member 2 and the substrate 1 was 0.3 mm, and the wiring patterns 5a and 5b were situated on the surface of the substrate 1. Accordingly, the distance between the conductive member 2 of the substrate 1 and the wiring patterns 5a and 5b was 0.3 mm. The conductive member 2 and the wiring patterns 5a and 5b were bonded by a dielectric insulating film having a relative dielectric constant of $\in_r=4$. The electrostatic coupling capacity value of the wiring patterns 5a and 5b and conductive member 2 (equivalent to the condenser 62) was 6.2 pF.

Figure 11:
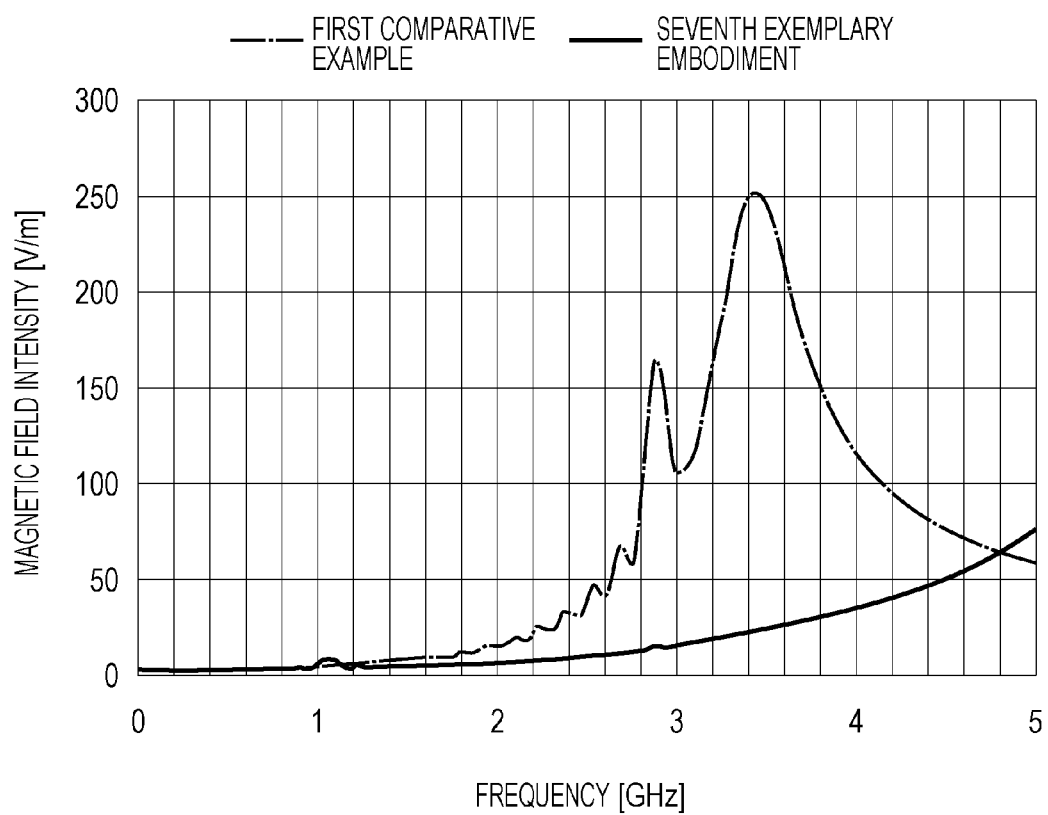
FIG. 11 is a graph illustrating advantages of the second embodiment.

3D numerical electromagnetic field analysis was performed regarding the seventh exemplary embodiment, in the same way as with the first through sixth exemplary embodiments. The software used and the analysis conditions were the same as with the first exemplary embodiment. FIG. 11 illustrates the analysis results thereof, along with the analysis results of the earlier-described first comparison example, for comparison. The horizontal axis represents the frequency of the irradiated electromagnetic waves, and the vertical axis represents the electric field intensity at the opening portion 21 of the conductive member 2.

First, looking at the electric field intensity of the first comparative example indicated by a single-dot dashed line, it can be seen that there is a sudden increase from around 2 GHz, with high levels of electric field intensity peaking at frequencies of 2.9 GHz and 3.4 GHz. This indicates that the semiconductor package according to the comparative example has low electromagnetic shielding capabilities of the conductive member at frequency bands above 2 GHz. This tendency indicated by analysis of the comparative example closely resembles the tendency actually measured as illustrated in FIG. 3B. Accordingly, we can say that the software used for analysis and the analysis model gave the correct results.

Looking at the results of the electric field intensity of the seventh exemplary embodiment indicated by a solid line, it can be seen that the electric field intensity around frequency of 3 GHz is approximately 20 V/m. This is markedly lower than the 250 V/m at 3.4 GHz given by the first comparative example. Accordingly, we can see that in the seventh exemplary embodiment, degradation of electromagnetic shielding capabilities is suppressed in the frequency band range of 1 to 5 GHz and that electromagnetic shielding of the semiconductor is improved.

Note that the analysis results of the seventh exemplary embodiment illustrated in FIG. 11 are almost the same as the results of the third exemplary embodiment illustrated in FIG. 7. The third exemplary embodiment realized the advantages preventing the high electromagnetic shielding capabilities from degrading by forming a high capacitance of 38 pF for the electrostatic coupling capacity value between the conductive member 2 and the wiring pattern 5.

Conversely, with the seventh exemplary embodiment, the electrostatic coupling capacity value between the conductive member 2 and the wiring patterns 5a and 5b is approximately 6.2 pF, meaning that a relatively low capacitance is formed. Accordingly, the semiconductor package according to the present embodiment enables wiring patterns to be formed with fewer design restrictions, so high immunity against electromagnetic waves can be obtained for the semiconductor circuit more easily.

While description has been made regarding the present embodiment that the wiring patterns 5a and 5b are connected to the ground wiring of the signal wiring layer 4, they may be connected to the power source wiring of the signal wiring layer 4. This arrangement also realizes the advantage of suppressing degradation in electromagnetic shielding capabilities. This arrangement is further advantageous in that the power source voltage of the semiconductor circuit is stabilized by the electrostatic coupling capacity between the wiring patterns 5a and 5b and the conductive member 2 (equivalent of the condenser 62). Accordingly, this is advantageous in that stable operation can be realized while improving immunity of the semiconductor circuit against electromagnetic waves.

Further, connection between the wiring patterns 5a and 5b and signal wiring layer 4 is not restricted to one point by a bonding wire 41; rather, two or more points may be provided. This is advantageous in that the electric potential between the conductive member 2 and signal wiring layer 4 further stabilizes, yielding even higher electromagnetic shielding capabilities.

Third Embodiment

Figure 12A:
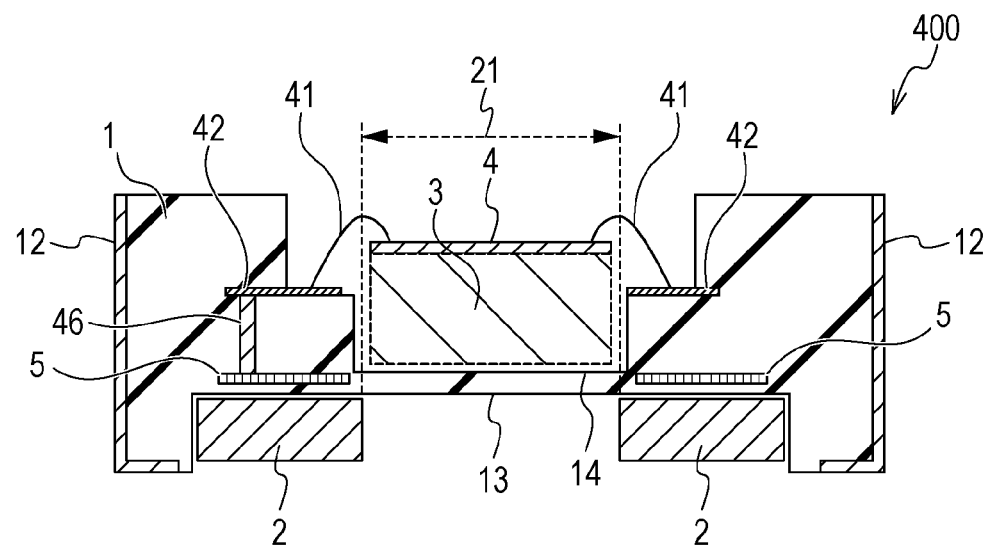
FIGS. 12A and 12B illustrate a semiconductor package according to a third embodiment.
Figure 12B:
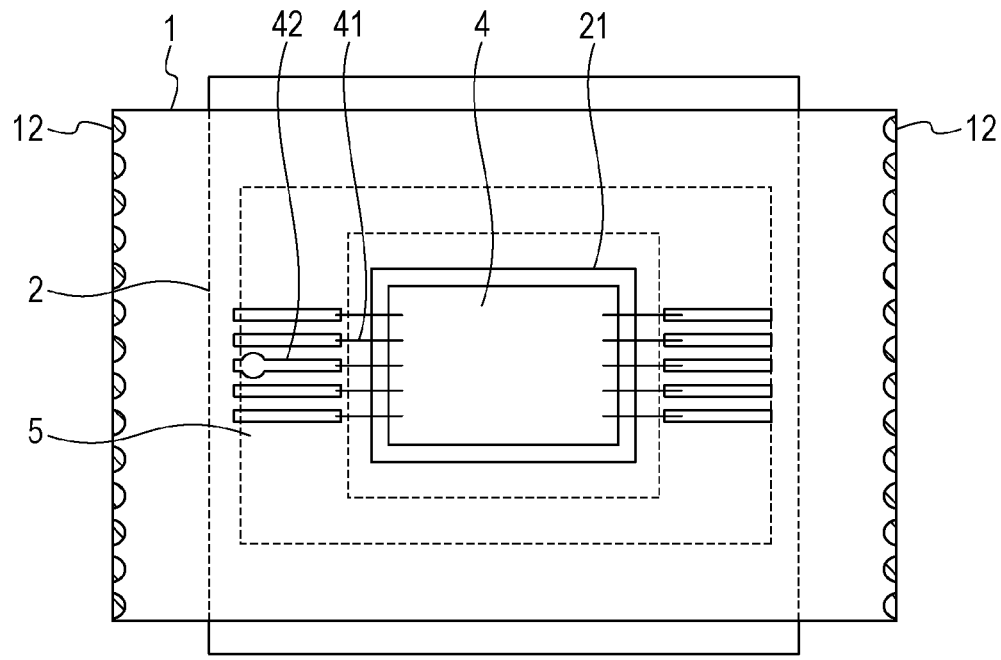

FIGS. 12A and 12B illustrate a semiconductor package 400 according to a third embodiment of the present invention. FIG. 12A is a diagram illustrating a cross-section, and FIG. 12B is a diagram illustrating a top face. Parts in FIGS. 12A and 23B which are the same as those of the first embodiment are denoted with the same reference numerals, and description thereof will be omitted.

The semiconductor package 400 is configured such that the substrate 1 has side face electrodes 12, and a recess 13 is formed on the surface of the substrate 1 opposite to the surface where the semiconductor element 3 is mounted. The conductive member 2 has an opening portion 21 formed at the middle. The opening portion 21 is greater than the outer dimensions of the semiconductor element 3. The conductive member 2 is disposed in the recess 13. The semiconductor element 3 is disposed in a recess 14 formed on the upper plane side of the substrate 1, at a position corresponding to the opening portion 21 of the conductive member 2 as illustrated in FIG. 12B. Thus, in plan view the semiconductor package 400 is arranged such that the opening portion 21 of the conductive member 2 surrounds the perimeter of the semiconductor element 3. The wiring pattern 5 is disposed on the surface of the opposite to the surface where the semiconductor element 3 is disposed, or within the substrate 1 near the surface thereof, so as to face the conductive member 2. The value of the electrostatic coupling capacity that occurs between the wiring pattern 5 and the conductive member 2 is no less than the value of the electrostatic coupling capacity that occurs between the signal wiring layer 4 and conductive member 2. The ground wiring of the signal wiring layer 4 and the wiring pattern 5 are electrically connected via bonding wires 41, the ground wire 42, and vias 46.

The present embodiment also enables degradation of electromagnetic shielding capabilities of the conductive member 2 to be suppressed even at high frequencies in the GHz band, due to operations the same as those of the first embodiment. Also, heat generated from the semiconductor element 3 is readily conducted to the conductive member 2 via the substrate 1, so an advantage is also obtained in that heat dissipation capabilities of the semiconductor package improves. The heat dissipation capabilities can be further improved by disposing a thermally conductive gel with good heat conductivity, or some other heat dissipation arrangement or the like, in the opening portion 21 of the conductive member 2 within the recess 13. The heat dissipation capabilities can be improved even further by connecting the conductive member 2 to an external heat dissipation arrangement.

While description has been made regarding the present embodiment that the wiring pattern 5 is connected to the ground wiring of the signal wiring layer 4, the connection may be to the power source wiring of the signal wiring layer 4. This arrangement also realizes the advantage of suppressing degradation in electromagnetic shielding capabilities. This arrangement is further advantageous in that the power source voltage of the semiconductor circuit is stabilized by the coupling capacity formed between the wiring pattern 5 and the conductive member 2. Accordingly, this is advantageous in that stable operation can be realized while improving immunity of the semiconductor circuit against electromagnetic waves.

Further, connection between the wiring pattern 5 and signal wiring layer 4 is not restricted to one point by a bonding wire 41; rather, two or more points may be provided. This is advantageous in that the electric potential between the conductive member 2 and signal wiring layer 4 further stabilizes, yielding even higher electromagnetic shielding capabilities.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-017618, filed Jan. 31, 2013, which is hereby incorporated by reference herein in its entirety.

What is claimed is:

1. A semiconductor package comprising:
   a substrate;
   a semiconductor element mounted on a surface of the substrate;
   a dielectric member;
   a conductive member having a frame shape or ring shape, disposed on the surface of the substrate to which the semiconductor element has been mounted by way of the dielectric member, such that the semiconductor element is exposed from an opening portion of the frame shape or ring shape;
   a wiring pattern formed on the substrate so as to face the conductive member;
   a signal wiring layer formed on the semiconductor element; and
   a terminal formed at the signal wiring layer as either a ground terminal or a power source terminal;
   wherein the wiring pattern is electrically connected to the terminal formed at the signal wiring layer formed on the semiconductor element;
   and wherein an electrostatic coupling capacity value between the conductive member and the wiring pattern is not less than an electrostatic coupling capacity value between the conductive member and the signal wiring layer.

2. The semiconductor package according to claim 1, further comprising:
   a terminal formed at the wiring pattern as either a ground terminal or a power source terminal;
   wherein the signal wiring layer is formed on the surface of the semiconductor element that is opposite to the surface to which the semiconductor element is mounted;
   and wherein the wiring pattern is electrically connected to the terminal formed at the signal wiring layer by a bonding wire.

3. The semiconductor package according to claim 2;
   wherein the electrostatic coupling capacity value between the conductive member and the wiring pattern is not less than 1.78 times the electrostatic coupling capacity value between the conductive member and the signal wiring layer.

4. The semiconductor package according to claim 2;
   wherein the wiring pattern and the ground terminal or power source terminal formed at the signal wiring layer provided to the semiconductor element are electrically connected at a plurality of locations.

5. The semiconductor package according to claim 1;
   wherein the wiring pattern is a frame-shaped or ring-shaped pattern disposed facing the conductive member.

6. The semiconductor package according to claim 1;
   wherein the wiring pattern is a frame-shaped or ring-shaped pattern disposed facing the conductive member, and is made up of two wiring patterns with gap portions formed at two locations facing each other.

7. The semiconductor package according to claim 1;
   wherein the semiconductor element is a sensor configured to receive external signals.

8. A semiconductor package comprising:
   a substrate;
   a semiconductor element mounted on a surface of the substrate;
   a dielectric member;
   a conductive member having a frame shape or ring shape, disposed on the surface of the substrate opposite to which the semiconductor element has been mounted by way of the dielectric member, such that in a plan view of the semiconductor element from the surface of the substrate or an opposite surface of the substrate, the conductive member surrounds the perimeter of the semiconductor element and an opening portion of the frame shape or ring shape is larger than the outer dimensions of the semiconductor element;

a wiring pattern formed on the substrate so as to face the conductive member;
a signal wiring layer formed on the semiconductor layer; and
a terminal formed at the signal wiring layer as either a ground terminal or a power source terminal;
wherein the wiring pattern is electrically connected to the terminal formed at the signal wiring layer provided to the semiconductor element;
and wherein an electrostatic coupling capacity value between the conductive member and the wiring pattern is not less than an electrostatic coupling capacity value between the conductive member and the signal wiring layer.

9. The semiconductor package according to claim 8, further comprising:
a terminal formed at the wiring pattern as either a ground terminal or a power source terminal;
wherein the signal wiring layer is formed on the surface of the semiconductor element that is opposite to the surface to which the semiconductor element is mounted;
and wherein the wiring pattern is electrically connected to the terminal formed at the signal wiring layer by a bonding wire.

10. The semiconductor package according to claim 9;
wherein the electrostatic coupling capacity value between the conductive member and the wiring pattern is not less than 1.78 times the electrostatic coupling capacity value between the conductive member and the signal wiring layer.

11. The semiconductor package according to claim 9;
wherein the wiring pattern and the ground terminal or power source terminal formed at the signal wiring layer provided to the semiconductor element are electrically connected at a plurality of locations.

12. The semiconductor package according to claim 8;
wherein the wiring pattern is a frame-shaped or ring-shaped pattern disposed facing the conductive member.

13. The semiconductor package according to claim 8;
wherein the wiring pattern is a frame-shaped or ring-shaped pattern disposed facing the conductive member, and is made up of two wiring patterns with gap portions formed at two locations facing each other.

14. The semiconductor package according to claim 8;
wherein the semiconductor element is a sensor configured to receive external signals.

* * * * *